US011723190B2

(12) United States Patent
Sheng et al.

(10) Patent No.: US 11,723,190 B2
(45) Date of Patent: Aug. 8, 2023

(54) CAPACITOR STRUCTURE AND METHOD FOR MANUFACTURING SAME

(71) Applicant: CHANGXIN MEMORY TECHNOLOGIES, INC., Hefei (CN)

(72) Inventors: Chaojun Sheng, Hefei (CN); Yong Lu, Hefei (CN)

(73) Assignee: CHANGXIN MEMORY TECHNOLOGIES, INC., Hefei (CN)

(*) Notice: Subject to any disclaimer, the term of this patent is extended or adjusted under 35 U.S.C. 154(b) by 0 days.

(21) Appl. No.: 17/439,586

(22) PCT Filed: Jun. 21, 2021

(86) PCT No.: PCT/CN2021/101292
§ 371 (c)(1),
(2) Date: Sep. 15, 2021

(87) PCT Pub. No.: WO2022/077947
PCT Pub. Date: Apr. 21, 2022

(65) Prior Publication Data
US 2022/0302122 A1    Sep. 22, 2022

(30) Foreign Application Priority Data

Oct. 15, 2020   (CN) .......................... 202011105560.5

(51) Int. Cl.
*H10B 12/00*   (2023.01)
*H01L 49/02*   (2006.01)
(52) U.S. Cl.
CPC ........... *H10B 12/315* (2023.02); *H01L 28/75* (2013.01); *H01L 28/91* (2013.01); *H10B 12/0335* (2023.02)

(58) Field of Classification Search
CPC ......... H01L 27/10814; H01L 27/10855; H01L 28/75; H10B 12/315; H10B 12/0335; H10B 12/033; H10B 12/03; H10B 12/30
See application file for complete search history.

(56) References Cited

U.S. PATENT DOCUMENTS 9,349,736 B2    5/2016  Hung et al.
2010/0187588 A1*  7/2010  Kim .................. H01L 27/10852
                                          257/306
(Continued)

FOREIGN PATENT DOCUMENTS

CN        104716019 A    6/2015
CN        108010913 A    5/2018
(Continued)

OTHER PUBLICATIONS

International Search Report and English Translation cited in PCT/CN2021/101292 dated Sep. 22, 2021, 9 pages.
(Continued)

*Primary Examiner* — Thanhha S Pham
(74) *Attorney, Agent, or Firm* — Cooper Legal Group, LLC

(57) ABSTRACT

The present disclosure provides a capacitor structure and a method for manufacturing same. The capacitor structure includes: a substrate, a first capacitor contact layer, a bottom electrode layer, a capacitor dielectric layer, and a top electrode layer, where the first capacitor contact layer is arranged on the substrate in an array manner, the bottom electrode layer surrounds a side wall of the first capacitor contact layer and extends in a direction of the first capacitor contact layer away from the substrate, the capacitor dielectric layer covers an upper surface of the substrate, a surface of the bottom
(Continued)

electrode layer and an upper surface of the first capacitor contact layer, and the top electrode layer covers a surface of the capacitor dielectric layer.

16 Claims, 8 Drawing Sheets

(56) References Cited

U.S. PATENT DOCUMENTS

| | | | | |
|---|---|---|---|---|
| 2012/0091519 | A1* | 4/2012 | Tu | H01L 28/91 |
| | | | | 257/532 |
| 2018/0166529 | A1* | 6/2018 | Park | H01L 27/10894 |
| 2020/0058654 | A1 | 2/2020 | Yang et al. | |

FOREIGN PATENT DOCUMENTS

| | | |
|---|---|---|
| CN | 108538835 A | 9/2018 |
| CN | 109065501 A | 12/2018 |
| CN | 209496851 U | 10/2019 |
| CN | 110504283 A | 11/2019 |

OTHER PUBLICATIONS

Written Opinion and English Translation cited in PCT/CN2021/101292 dated Sep. 22, 2021, 6 pages.

* cited by examiner

CAPACITOR STRUCTURE AND METHOD FOR MANUFACTURING SAME

CROSS-REFERENCE TO RELATED APPLICATIONS

The present application claims the priority to Chinese Patent Application 202011105560.5, titled "CAPACITOR STRUCTURE AND METHOD FOR MANUFACTURING SAME", filed on Oct. 15, 2020, which is incorporated herein by reference in its entirety.

TECHNICAL FIELD

The present disclosure relates to the technical field of memory manufacturing, and in particular to a capacitor structure and a method for manufacturing same.

BACKGROUND

A dynamic random access memory (DRAM) is a semiconductor memory commonly used in computers. A capacitor and a transistor as a unit of the DRAM are usually arranged in a two-dimensional matrix manner, and its main action principle is to use charge stored in the capacitor to indicate that a binary bit is 1 or 0. As a manufacturing process keeps evolving, an integration level of the DRAM keeps improving, a component size keeps reducing, and capacity of the capacitor to store the charge is also tested. At present, most capacitors in DRAMs are of single-sided capacitor structures, which limits improvement of capacitance per unit area. Thus, in order to improve the capacity of the capacitor to store the charge, a double-sided capacitor structure capable of increasing a surface area of an electrode layer is introduced.

In the existing double-sided capacitor structure, the capacitor is arranged on a capacitor contact layer, and resistance of the double-sided capacitor structure is large because a contact area between a bottom electrode plate and the capacitor contact layer is small and an area of the capacitor is small.

SUMMARY

In a first aspect, the present disclosure provides a capacitor structure. The capacitor structure includes:
 a substrate;
 a first capacitor contact layer, arranged on the substrate in an array manner;
 a bottom electrode layer, surrounding a side wall of the first capacitor contact layer and extending in a direction of the first capacitor contact layer away from the substrate;
 a capacitor dielectric layer, covering an upper surface of the substrate, a surface of the bottom electrode layer and an upper surface of the first capacitor contact layer; and
 a top electrode layer, covering a surface of the capacitor dielectric layer.

In a second aspect, the present disclosure provides a method for manufacturing a capacitor structure. The method includes:
 providing a substrate;
 forming a conducting layer on the substrate, and forming a capacitor stacking layer on the conducting layer;
 patterning the capacitor stacking layer and the conducting layer to form at least one capacitor column arranged in an array manner and a first capacitor contact layer corresponding to the at least one capacitor column in a one-to-one manner;
 depositing a first electrode layer to cover a side wall of the at least one capacitor column and a side wall of the first capacitor contact layer;
 removing the at least one capacitor column, and keeping the first electrode layer and the first capacitor contact layer;
 depositing a capacitor dielectric layer to cover the first electrode layer; and
 depositing a second electrode layer to cover the capacitor dielectric layer.

DETAILED DESCRIPTION

Figure 1:
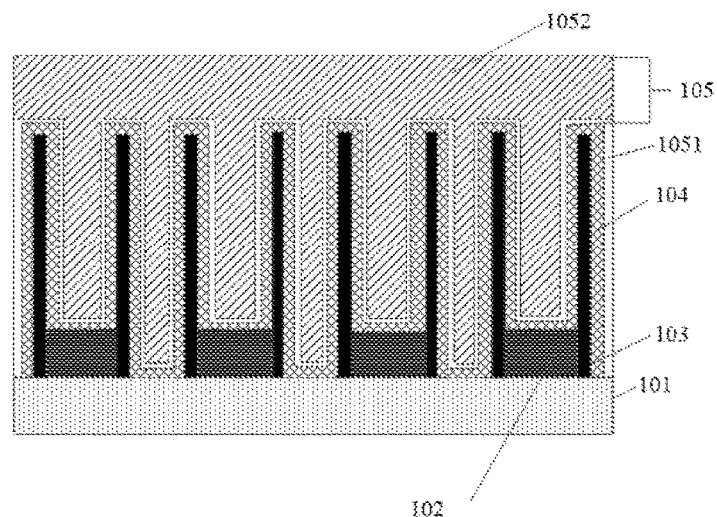
FIG. 1 is a schematic diagram of a capacitor structure provided in embodiments of the present disclosure.

The technical solutions of embodiments of the present disclosure will be described below clearly and comprehensively in conjunction with accompanying drawings of the embodiments of the present disclosure. Apparently, the embodiments described are merely some of, rather than all of, the embodiments of the present disclosure. Based on the embodiments of the present disclosure, all other embodiments obtained by those of ordinary skill in the art without making creative efforts fall within the scope of protection of the present disclosure.

The terms "first", "second", etc., in the specification and claims of the present disclosure and in the drawings, are used to distinguish between similar objects and not necessarily to describe a particular order or sequential order. It should be understood that the data so used are interchangeable under appropriate circumstances so that the embodiments of the present disclosure described herein can be implemented in an order rather than those illustrated or described herein, for example.

Moreover, the terms "including/comprising" and "having" as well as any variations thereof are intended to mean covered and non-exclusive inclusion, for example, a process, a method, a system, a product or an apparatus including a series of steps or units does not need to be limited by those explicitly listed, but may include other steps or units not explicitly listed or inherent to these processes, methods, products or apparatuses.

In an existing double-sided capacitor structure, a capacitor is arranged on a capacitor contact layer, and resistance of the double-sided capacitor structure is large because a contact area between a bottom electrode plate and the capacitor contact layer is small and an area of the capacitor is small. In order to solve the problem, the present disclosure provides a capacitor structure, since a bottom electrode layer is further arranged at a position surrounding a circle of a side wall of a first capacitor contact layer, that is, the bottom electrode layer encircles the side wall of the first capacitor contact layer, a contact area between the bottom electrode layer and the first capacitor contact layer may be increased, and since a capacitor dielectric layer covers a surface of the bottom electrode layer, the capacitor dielectric layer further covers a part, except the first capacitor contact layer arranged in an array manner, of an upper surface of a substrate, and a top electrode layer covers a surface of the capacitor dielectric layer, compared with an existing capacitor structure, the present disclosure increases an area of the capacitor encircling the side wall of the first capacitor contact layer, thereby improving the area of the capacitor and reducing the resistance of the double-sided capacitor structure. A specific structure of the capacitor structure provided in the present disclosure is described in detail with reference to the drawings and the specific embodiments below.

The capacitor structure provided in the present disclosure may be applied to a semiconductor memory, for example, a dynamic random access memory, which includes a plurality of repeated memory cells, each of the memory cells may include a capacitor and a transistor, a gate electrode of the transistor is connected to a word line, a drain electrode of the transistor is connected to a bit line, and a source electrode of the transistor is connected to the capacitor, where the capacitor may use the capacitor structure provided in the present disclosure. The capacitor structure provided in the present disclosure may be further applied to other semiconductor devices, which is not limited.

FIG. 1 is a schematic diagram of the capacitor structure provided in the embodiments of the present disclosure. As shown in FIG. 1, the capacitor structure of the present embodiment may include: the substrate 101, the first capacitor contact layer 102, the bottom electrode layer 103, the capacitor dielectric layer 104 and the top electrode layer 105.

The substrate 101 may be made of Si, Ge, GeSi or SiC, SOI or GOI, or other materials.

In some embodiments, the substrate 101 is provided with active areas and groove isolation structures isolating each active area, the semiconductor device may be formed on the active area of the substrate 101, and the semiconductor device may be the transistor for example.

Figure 2:
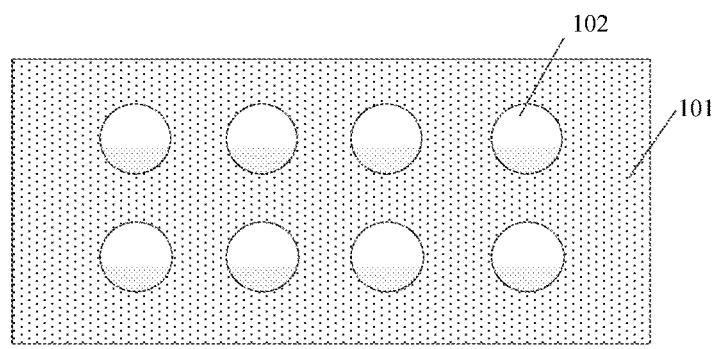
FIG. 2 is a top view of a first capacitor contact layer.

The first capacitor contact layer 102 is arranged on the substrate 101 in an array manner, which may be arranged on the substrate 101 at equal intervals, or may be not arranged on the substrate 101 at equal intervals, and a section of the first capacitor contact layer 102 may be circular, square, rectangular or in other shapes. With arranging 8 capacitors on the substrate 101 as an example, FIG. 2 is a top view of the first capacitor contact layer. As shown in FIG. 2, a section of the first capacitor contact layer 102 is circular, the first capacitor contact layer 102 has a certain height, and the first capacitor contact layer 102 may be of a cylinder-shaped structure. It may be understood that the first capacitor contact layer 102 may also be of other columnar structures. The first capacitor contact layer 102 may be made of metal, and the metal may specifically be W, etc.

In some embodiments, when the transistor is formed on an active area of the substrate 101, the first capacitor contact layer 102 is electrically connected to the transistor.

As shown in FIG. 1, the bottom electrode layer 103 surrounds the side wall of the first capacitor contact layer 102 and extends in a direction of the first capacitor contact layer 102 away from the substrate 101, a lower surface of the bottom electrode layer 103 contacts with the substrate 101 directly, and the bottom electrode layer 103 has a certain height. As an implementable mode, the bottom electrode layer 103 may be made of a compound formed by at least one of metal nitride and metal silicide, such as TiN, TiSi or TiSiN.

The capacitor dielectric layer 104 covers the upper surface of the substrate 101, the surface of the bottom electrode layer 103 and an upper surface of the first capacitor contact layer 102, and the top electrode layer 105 covers the surface of the capacitor dielectric layer 104. In some embodiments, the capacitor dielectric layer 104 may be made of a high-K dielectric material so as to improve capacitance per area of the capacitor, which includes a stacking layer formed by one of ZrOx, HfOx, ZrTiOx, RuOx, SbOx and AlOx, or two or more of groups composed of the above materials. The capacitor dielectric layer 104 may also be made of silicon oxide or other insulating materials.

In the present embodiment, since the first capacitor contact layer 102 is arranged on the substrate 101 in the array manner, and the bottom electrode layer 103 surrounds the side wall of the first capacitor contact layer 102, that is, the bottom electrode layer 103 encircles the side wall of the first capacitor contact layer 102, the contact area between the bottom electrode layer 103 and the first capacitor contact layer 102 may be increased; and the capacitor dielectric layer 104 covers the part, except the first capacitor contact layer 102 arranged in the array manner, of the upper surface of the substrate 101, and the top electrode layer 105 covers the surface of the capacitor dielectric layer 104, so compared with the existing capacitor structure with the capacitor arranged on the first capacitor contact layer, the present disclosure increases the area of the capacitor encircling the side wall of the first capacitor contact layer 102, thereby improving the area of the capacitor and reducing the resistance of the double-sided capacitor structure.

Furthermore, in an implementable mode, the top electrode layer 105 includes a top electrode material layer 1051 and a top electrode filling layer 1052, the top electrode material layer 1051 covering the surface of the capacitor dielectric layer 104, and the top electrode filling layer 1052 being located at an upper surface of the top electrode material layer 1051. As an implementable mode, the top electrode material layer 1051 may be made of the compound formed by at least one of the metal nitride and the metal silicide, such as the TiN, the TiSi or the TiSiN.

The top electrode filling layer 1052 may be made of polycrystalline silicon or silicon germanium.

The capacitor structure provided in the present embodiment is composed of the substrate, the first capacitor contact layer, the bottom electrode layer, the capacitor dielectric layer and the top electrode layer, where the first capacitor contact layer is arranged on the substrate in the array manner, the bottom electrode layer surrounds the side wall of the first capacitor contact layer and extends in the direction of the first capacitor contact layer away from the substrate, the capacitor dielectric layer covers the upper surface of the substrate, the surface of the bottom electrode layer and the upper surface of the first capacitor contact layer, and the top electrode layer covers the surface of the capacitor dielectric layer. Since the first capacitor contact layer is arranged on the substrate in the array manner, and the bottom electrode layer surrounds the side wall of the first capacitor contact layer, that is, the bottom electrode layer encircles the side wall of the first capacitor contact layer, a contact area between the bottom electrode layer and the first capacitor contact layer may be increased; and the capacitor dielectric layer covers a part, except the first capacitor contact layer arranged in the array manner, of the upper surface of the substrate, and the top electrode layer covers the surface of the capacitor dielectric layer, so compared with an existing capacitor structure with a capacitor arranged on a first capacitor contact layer, the present disclosure increases an area of the capacitor encircling the side wall of the first capacitor contact layer, thereby improving the area of the capacitor and reducing the resistance of the double-sided capacitor structure.

Figure 3:
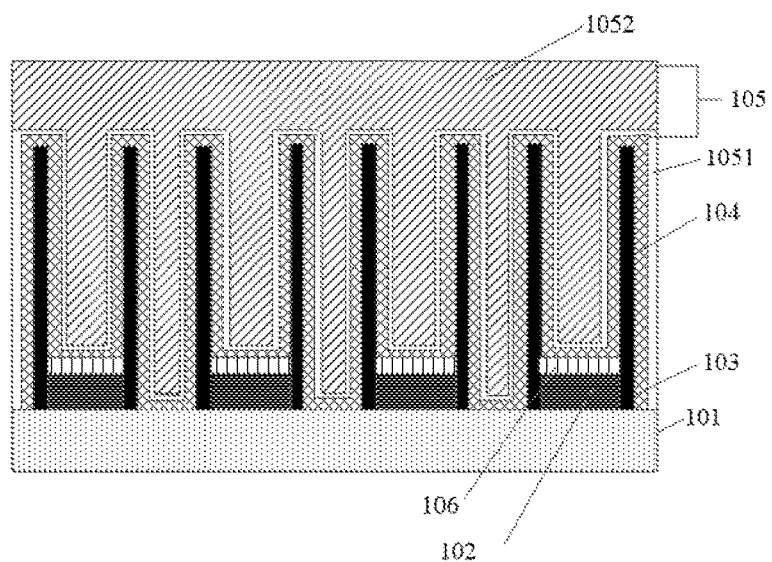
FIG. 3 is a schematic diagram of the capacitor structure provided in the embodiments of the present disclosure.

FIG. 3 is a schematic diagram of the capacitor structure provided in the embodiments of the present disclosure. As shown in FIG. 3, the capacitor structure provided in the present embodiment further includes, on the basis of the capacitor structure shown in FIG. 1, a second capacitor contact layer 106, the second capacitor contact layer 106 is located at an upper surface of the first capacitor contact layer 102, and the second capacitor contact layer is consistent with the first capacitor contact layer in shape, for example, if a section of the first capacitor contact layer 102 is circular, a section of a conducting layer is also circular. In the present embodiment, the capacitor dielectric layer 104 covers the upper surface of the substrate 101, the surface of the bottom electrode layer 103 and an upper surface of the second capacitor contact layer 106. The second capacitor contact layer 106 may be consistent with the bottom electrode layer 103 in material. For example, the second capacitor contact layer 106 may be made of a compound formed by at least one of metal nitride and metal silicide, such as TiN, TiSi or TiSiN. The second capacitor contact layer 106 is additionally provided, so that on the one hand, the first capacitor contact layer 102 may be prevented from diffusing toward the capacitor dielectric layer 104, for example, when the first capacitor contact layer 102 is made of metal W and the capacitor dielectric layer 104 is made of silicon oxide, the metal W may be prevented from diffusing toward the silicon oxide; and on the other hand, the second capacitor contact layer 106 may also serve as the bottom electrode layer, and thus areas of the bottom electrode layer and the first capacitor contact layer 102 may be increased, thereby improving the area of the capacitor.

A method for manufacturing the capacitor structure provided in the present disclosure is described in detail with reference to the drawings below.

Figure 4:
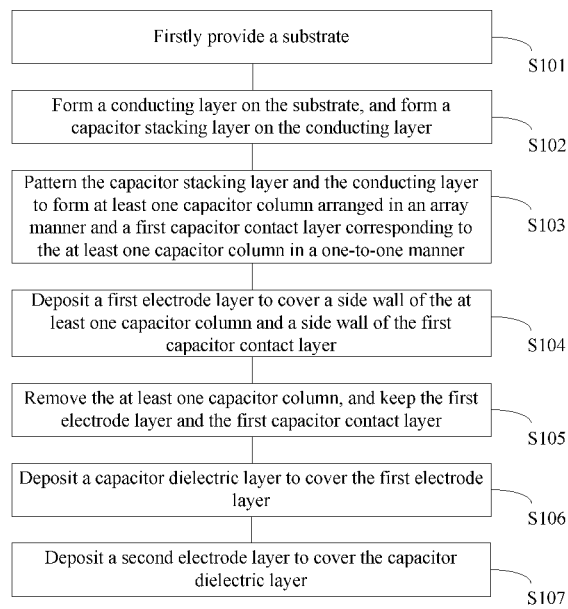
FIG. 4 is a schematic flowchart of a method for manufacturing the capacitor structure provided in the embodiments of the present disclosure.

FIG. 4 is a schematic flowchart of the method for manufacturing the capacitor structure provided in the embodiments of the present disclosure. As shown in FIG. 4, the method of the present embodiment may include the steps as follows:

S101, a substrate is firstly provided.

Figure 5:
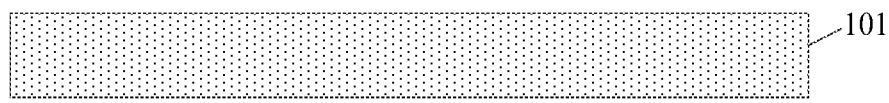
FIG. 5 is a schematic structural diagram of a substrate in a forming process of the capacitor structure provided in the embodiments of the present disclosure.

FIG. 5 is a schematic structural diagram of the substrate in a forming process of the capacitor structure provided in the embodiments of the present disclosure. As shown in FIG. 5, the substrate 101 is provided firstly, and the substrate 101 may be made of Si, Ge, GeSi or SiC, SOI or GOI, or other materials.

In some embodiments, the substrate 101 is provided with active areas and groove isolation structures isolating each active area, the semiconductor device may be formed on the active area of the substrate 101, and the semiconductor device may be the transistor for example.

S102, a conducting layer is formed on the substrate, and a capacitor stacking layer is formed on the conducting layer.

Figure 6:
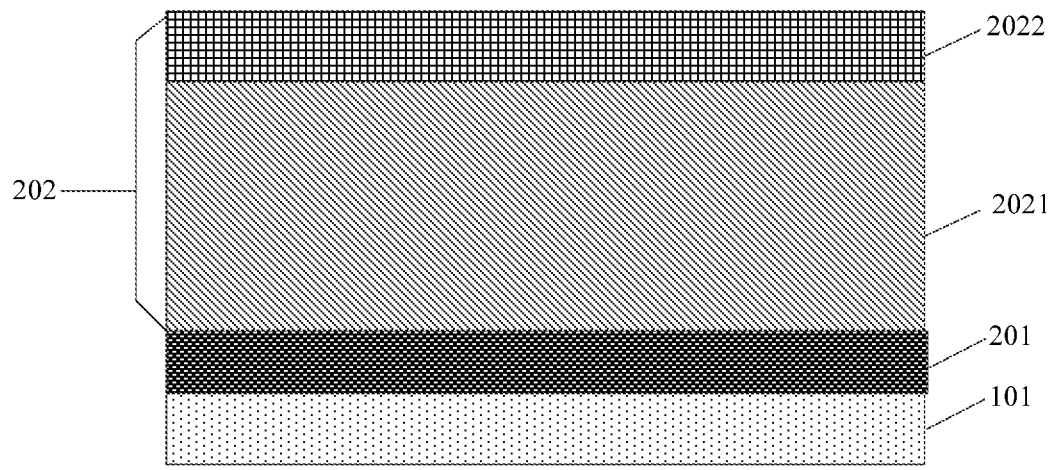
FIG. 6 is a schematic structural diagram of a conducting layer and a capacitor stacking layer in the forming process of the capacitor structure provided in the embodiments of the present disclosure.

FIG. 6 is a schematic structural diagram of the conducting layer and the capacitor stacking layer in the forming process of the capacitor structure provided in the embodiments of the present disclosure. With reference to FIG. 6, the conducting layer 201 is formed on the substrate 101, the capacitor stacking layer 202 is formed on the conducting layer 201, and the capacitor stacking layer 202 includes a sacrificial layer 2021 and a top supporting layer 2022.

S103, the capacitor stacking layer and the conducting layer are patterned to form at least one capacitor column arranged in an array manner and the first capacitor contact layer corresponding to the capacitor column in a one-to-one manner.

Figure 7:
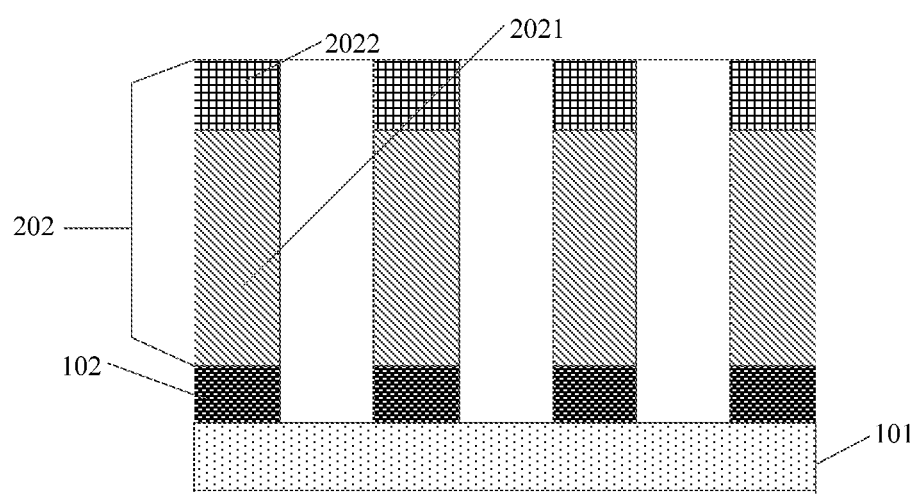
FIG. 7 is a schematic structural diagram of at least one capacitor column formed in the forming process of the capacitor structure provided in the embodiments of the present disclosure.

FIG. 7 is a schematic structural diagram of the at least one capacitor column formed in the forming process of the capacitor structure provided in the embodiments of the present disclosure. With reference to FIGS. 6 and 7, the capacitor stacking layer 202 and the conducting layer 201 are patterned to form the at least one capacitor column 203 arranged in the array manner and the first capacitor contact layer 102 corresponding to the capacitor column 203 in the one-to-one manner.

Figure 8:
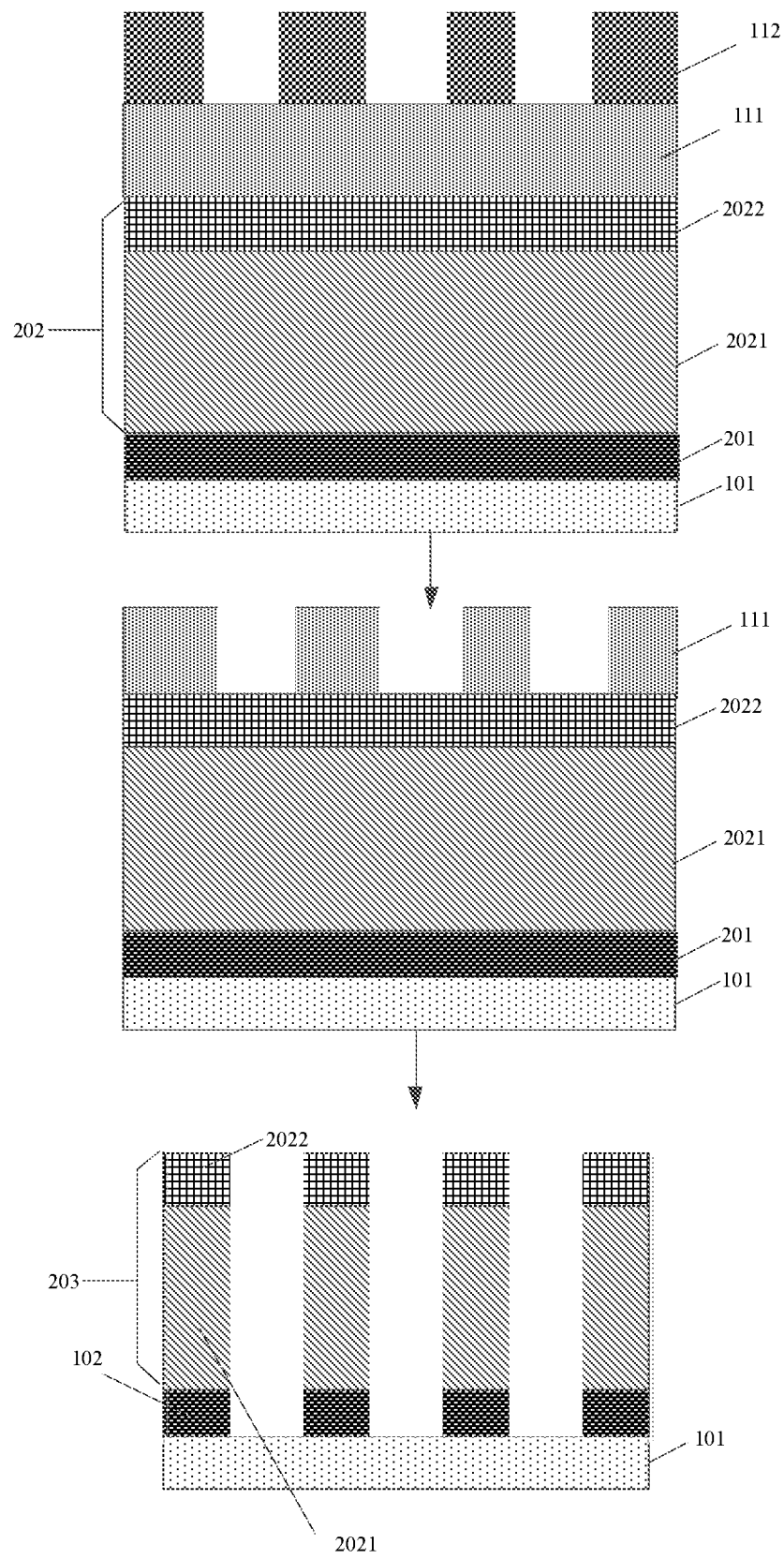
FIG. 8 is a schematic diagram of a process of patterning the capacitor stacking layer and the conducting layer in the forming process of the capacitor structure provided in the embodiments of the present disclosure.

Specifically, FIG. 8 is a schematic diagram of a process of patterning the capacitor stacking layer and the conducting layer in the forming process of the capacitor structure provided in the embodiments of the present disclosure. As an implementable mode, the step that the capacitor stacking layer 202 and the conducting layer 201 are patterned to form the at least one capacitor column 203 arranged in the array manner and the first capacitor contact layer 102 corresponding to the capacitor column 203 in the one-to-one manner, may include the following steps:

with reference to FIG. 8, a mask layer 111 is deposited to cover the top supporting layer 2022 in the capacitor stacking layer 202, where the mask layer may be of a single-layer structure or a multi-layer structure, and the mask layer may include polycrystalline silicon, carbon and silicon oxynitride when being of the multi-layer structure; then a negative photoresistor 112 is formed to cover the mask layer 111; and then exposure and development are conducted, and etch down along the negative and photoresistor 112 to the mask layer 111 and then to the substrate 101 to form the at least one capacitor column 203 arranged in the array manner and the first capacitor contact layer 102 corresponding to the capacitor column 203 in the one-to-one manner. By using a characteristic that a place exposed by the negative photoresistor will be remained, a capacitor column structure with a specific shape (such as a circle) may be directly obtained. In other embodiments, the capacitor column with a specific shape may also be obtained by means of two times of patterning processes, including a self-aligned double patterning process or a reverse self-aligned double patterning process.

S104, a first electrode layer is deposited to cover a side wall of the at least one capacitor column and a side wall of the first capacitor contact layer.

Figure 9:
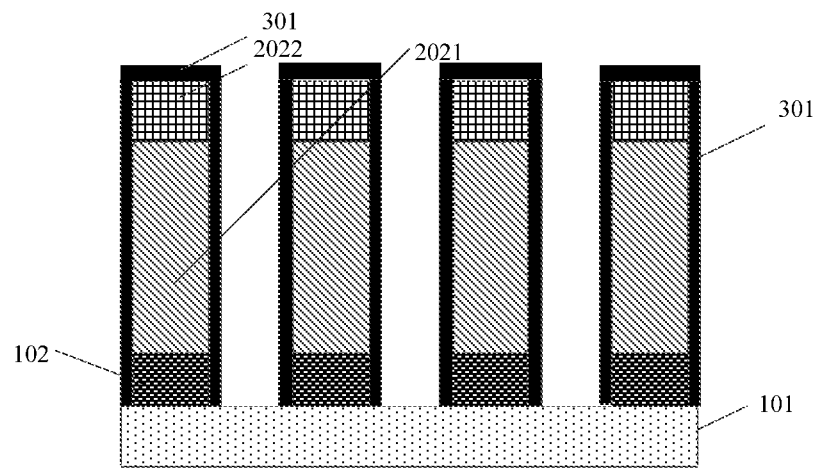
FIG. 9 is a schematic diagram of a structure after a first electrode layer is deposited in the forming process of the capacitor structure provided in the embodiments of the present disclosure.

FIG. 9 is a schematic diagram of a structure after the first electrode layer is deposited in the forming process of the capacitor structure provided in the embodiments of the present disclosure. With reference to FIG. 9, the first electrode layer 301 is deposited to cover the side wall of the at least one capacitor column 203 and the side wall of the first capacitor contact layer 102, the first electrode layer 301 may be deposited using an atomic layer deposition method, and meanwhile an upper surface of the substrate is also covered. A deposition process herein may be chemical vapor deposition, plasma enhanced chemical vapor deposition, low pressure chemical vapor deposition, etc.

S105, the at least one capacitor column is removed, and the first electrode layer and the first capacitor contact layer are kept.

Figure 10:
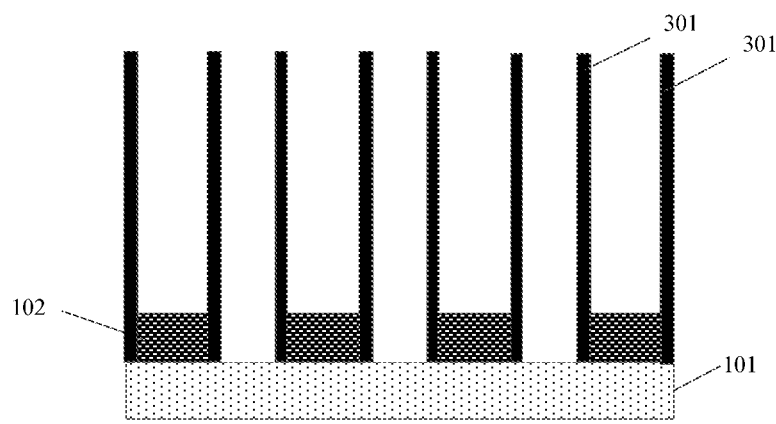
FIG. 10 is a schematic diagram of a structure after a capacitor column is removed in the forming process of the capacitor structure provided in the embodiments of the present disclosure.

Then, FIG. 10 is a schematic diagram of a structure after the capacitor column is removed in the forming process of the capacitor structure provided in the embodiments of the present disclosure. With reference to FIG. 10, the capacitor column 203 is removed, the first electrode layer 301 and the first capacitor contact layer 102 are kept, and a part, located at an upper surface of the capacitor column 203, of the first electrode layer 301 and a part, located at the upper surface of the substrate 101, of the first electrode layer 301 are removed accordingly while the capacitor column 203 is removed.

Figure 11:
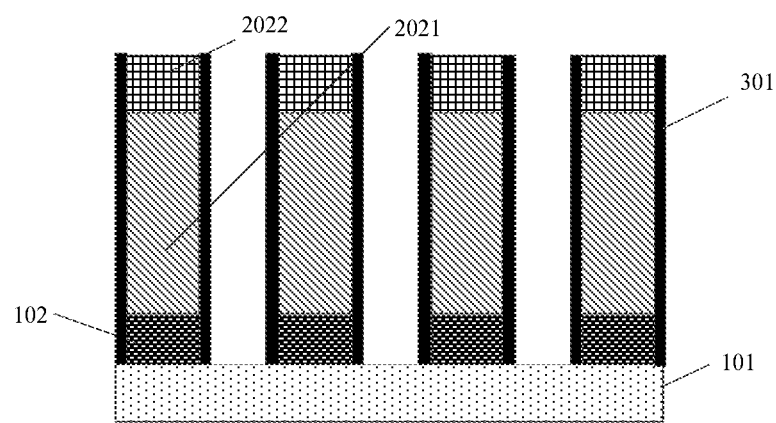
FIG. 11 is a schematic diagram of a structure after a part, on an upper surface of the substrate, of the first electrode layer is removed in the forming process of the capacitor structure provided in the embodiments of the present disclosure.

In some embodiments, FIG. 11 is a schematic diagram of a structure after the part, at the upper surface of the substrate, of the first electrode layer is removed in the forming process of the capacitor structure provided in the embodiments of the present disclosure. With reference to FIG. 11, the part, at the upper surface of the substrate, of the first electrode layer 301 is removed firstly.

Figure 12:
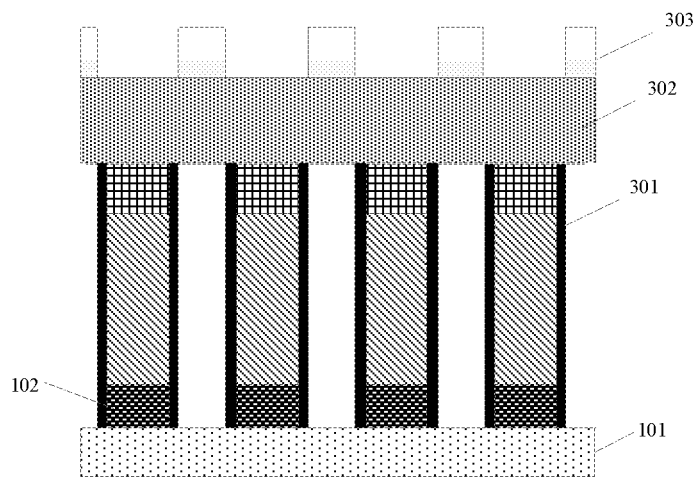
FIG. 12 is a schematic diagram of a structure after a mask layer is deposited and a photoresistor is formed in the forming process of the capacitor structure provided in the embodiments of the present disclosure.

FIG. 12 is a schematic diagram of a structure after the mask layer is deposited and a photoresistor is formed in the forming process of the capacitor structure provided in the embodiments of the present disclosure. With reference to FIG. 12, the step that the capacitor column 203 is removed may specifically include the following steps that the mask layer 302 is deposited to cover the upper surface of the capacitor column 203, and then the photoresistor 303 is formed to cover the mask layer 302, and the photoresistor 303 is provided with openings corresponding to the capacitor columns 203 in a one-to-one manner. The deposition process herein may be the chemical vapor deposition, the plasma enhanced chemical vapor deposition, the low pressure chemical vapor deposition, etc.

Figure 13:
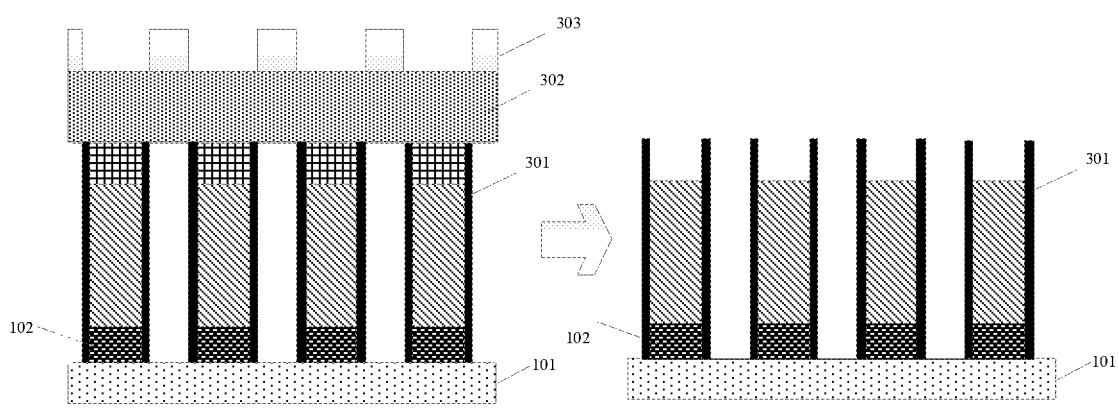
FIG. 13 is a schematic diagram of a process of removing the capacitor column in the forming process of the capacitor structure provided in the embodiments of the present disclosure.

FIG. 13 is a schematic diagram of a process of removing the capacitor column in the forming process of the capacitor structure provided in the embodiments of the present disclosure. With reference to FIG. 13, the mask layer 302, the top supporting layer 2022 and the sacrificial layer 2021 are removed along the openings to obtain the structure shown in FIG. 10. In some embodiments, the top supporting layer 2022 may be removed through dry etching, the sacrificial layer 2021 may be removed through dry etching and wet etching, and the sacrificial layer 2021 may be completely removed through wet etching. It should be explained that in the structure shown in FIG. 10, the first electrode layer 301 corresponds to the bottom electrode layer 103 shown in FIG. 1, and serves as the bottom electrode layer 103.

S106, a capacitor dielectric layer is deposited to cover the first electrode layer.

Figure 14:
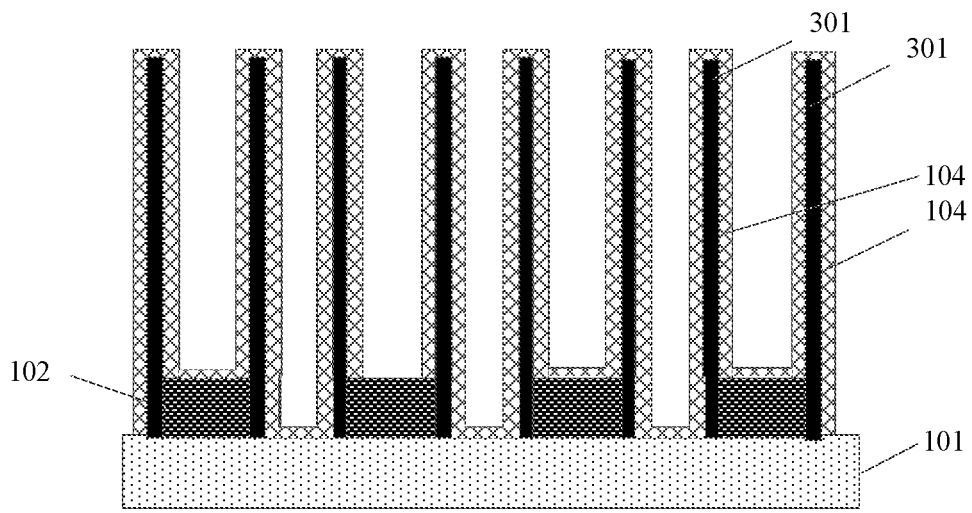
FIG. 14 is a schematic diagram of a structure after a capacitor dielectric layer is deposited in the forming process of the capacitor structure provided in the embodiments of the present disclosure.

The structure shown in FIG. 10 is obtained, and then FIG. 14 is a schematic diagram of a structure after the capacitor dielectric layer is deposited in the forming process of the capacitor structure provided in the embodiments of the present disclosure. With reference to FIG. 14, the capacitor dielectric layer 104 is deposited to cover the first electrode layer 301.

S107, a second electrode layer is deposited to cover the capacitor dielectric layer.

Specifically, the second electrode layer (corresponding to the top electrode layer 105 shown in FIG. 1) is deposited to cover the capacitor dielectric layer 104.

Figure 15:
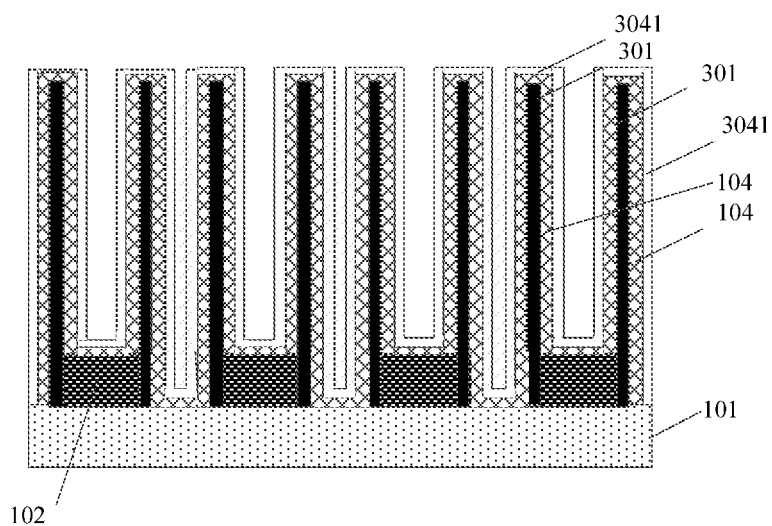
FIG. 15 is a schematic diagram of a structure after a top electrode material layer is deposited in the forming process of the capacitor structure provided in the embodiments of the present disclosure.
Figure 16:
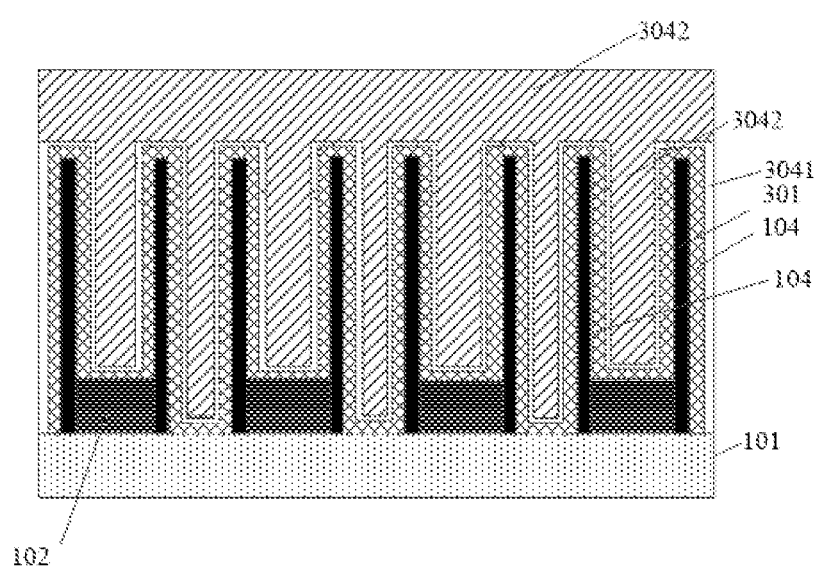
FIG. 16 is a schematic diagram of a structure after a top electrode filling layer is deposited in the forming process of the capacitor structure provided in the embodiments of the present disclosure.

Specifically, the second electrode layer 304 includes a top electrode material layer 3041 and a top electrode filling layer 3042, and FIG. 15 is a schematic diagram of a structure after the top electrode material layer is deposited in the forming process of the capacitor structure provided in the embodiments of the present disclosure. With reference to FIG. 15, the step that the second electrode layer 304 is deposited to cover the capacitor dielectric layer 104 may include the following steps:

the top electrode material layer 3041 is deposited to cover a surface of the capacitor dielectric layer 104, and FIG. 16 is a schematic diagram of a structure after the top electrode filling layer is deposited in the forming process of the capacitor structure provided in the embodiments of the present disclosure. Further, with reference to FIG. 16, the top electrode filling layer 3042 is deposited to cover an upper surface of the top electrode material layer 3041. It should be explained that the top electrode material layer 3041 corresponds to the top electrode material layer 1051 shown in FIG. 1, and the top electrode filling layer 3042 corresponds to the top electrode filling layer 1052 shown in FIG. 1.

According to the method for manufacturing the capacitor structure, which is provided in the present embodiment, the manufactured capacitor structure is composed of the substrate, the first capacitor contact layer, the bottom electrode layer, the capacitor dielectric layer and the top electrode layer, where the first capacitor contact layer is arranged on the substrate in the array manner, the bottom electrode layer surrounds the side wall of the first capacitor contact layer and extends in the direction of the first capacitor contact layer away from the substrate, the capacitor dielectric layer covers the upper surface of the substrate, the surface of the bottom electrode layer and the upper surface of the first capacitor contact layer, and the top electrode layer covers the surface of the capacitor dielectric layer. Since the first capacitor contact layer is arranged on the substrate in the array manner, and the bottom electrode layer surrounds the side wall of the first capacitor contact layer, that is, the bottom electrode layer encircles the side wall of the first capacitor contact layer, a contact area between the bottom electrode layer and the first capacitor contact layer may be increased; and the capacitor dielectric layer covers a part, except the first capacitor contact layer arranged in the array manner, of the upper surface of the substrate, and the top electrode layer covers the surface of the capacitor dielectric layer, so compared with an existing capacitor structure with a capacitor arranged on a first capacitor contact layer, the present disclosure increases an area of the capacitor encircling the side wall of the first capacitor contact layer, thereby improving the area of the capacitor and reducing the resistance of the double-sided capacitor structure.

Furthermore, in a process of manufacturing the above capacitor structure, in another implementable mode, the conducting layer includes a first conducting layer and a second conducting layer, the second conducting layer being consistent with the first electrode layer in material. After the conducting layer is formed on the substrate, the method may further include the following steps that the second conducting layer is electrically connected to the first electrode layer, so as to form a bottom electrode by the second conducting layer and the first electrode layer. A process shown in FIG. 17 is taken as an example for specific description.

Figure 17:
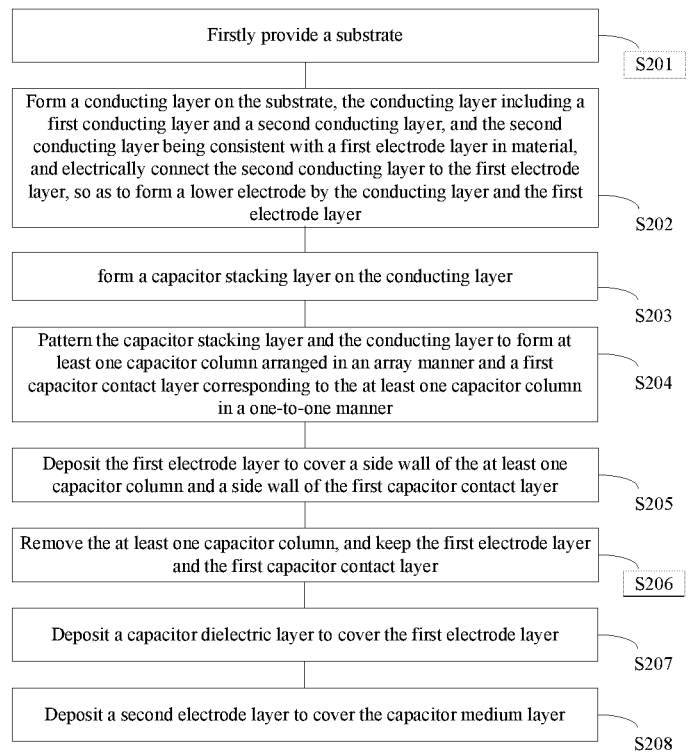
FIG. 17 is a schematic flowchart of the method for manufacturing the capacitor structure provided in the embodiments of the present disclosure.

FIG. 17 is a schematic flowchart of the method for manufacturing the capacitor structure provided in the embodiments of the present disclosure. As shown in FIG. 17, the method of the present embodiment may include the steps as follows:

S201, a substrate is firstly provided.

S202, a conducting layer is formed on the substrate, the conducting layer including a first conducting layer and a second conducting layer, and the second conducting layer being consistent with a first electrode layer in material, and the second conducting layer is electrically connected to the first electrode layer, so as to form a bottom electrode by the second conducting layer and the first electrode layer.

S203, a capacitor stacking layer is formed on the conducting layer.

S204, the capacitor stacking layer and the conducting layer are patterned to form at least one capacitor column arranged in an array manner and the first capacitor contact layer corresponding to the at least one capacitor column in a one-to-one manner.

S205, the first electrode layer is deposited to cover a side wall of the at least one capacitor column and a side wall of the first capacitor contact layer.

S206, the at least one capacitor column is removed, and the first electrode layer and the first capacitor contact layer are kept.

S207, a capacitor dielectric layer is deposited to cover the first electrode layer.

S208, a second electrode layer is deposited to cover the capacitor dielectric layer.

In the present embodiment, a specific process is consistent with the process shown in FIG. 4, which is not repeated herein, and finally, the capacitor structure shown in FIG. 3 is formed. In the present embodiment, because the conducting layer includes the first conducting layer and the second conducting layer (that is, the second capacitor contact layer 106 in FIG. 3), and the second conducting layer is consistent with the first electrode layer in material, compared with the manufacturing method shown in FIG. 4, on the one hand, the present embodiment may prevent, by additionally providing the second conducting layer, the first capacitor contact layer from diffusing toward a capacitor dielectric layer, for example, when the first capacitor contact layer is made of the metal W and the capacitor dielectric layer is made of the silicon oxide, the metal W may be prevented from diffusing toward the silicon oxide; and on the other hand, the second conducting layer may also serve as the bottom electrode layer, and thus the areas of the bottom electrode layer and the first capacitor contact layer may be increased, thereby improving the area of the capacitor.

The embodiments of the present disclosure further provide a memory. The memory includes any of the above capacitor structures.

Finally, it should be noted that the above embodiments are only used to explain the technical solutions of the present disclosure, but not to limit it; although the present disclosure is described in detail with reference to the embodiments, those of ordinary skill in the art should understand that they may still make modifications to the technical solutions described in the above embodiments or equivalent replacements to part or all of technical features therein; and these modifications or replacements do not make the essence of the corresponding technical solutions depart from the scope of the technical solutions of the embodiments of the present disclosure.

The invention claimed is:

1. A capacitor structure, comprising:
   a substrate;
   a first capacitor contact layer, arranged directly on the substrate in an array manner;
   a bottom electrode layer, surrounding a side wall of the first capacitor contact layer and extending in a direction of the first capacitor contact layer away from the substrate;
   a capacitor dielectric layer, covering an upper surface of the substrate, a surface of the bottom electrode layer and an upper surface of the first capacitor contact layer;
   a top electrode layer, covering a surface of the capacitor dielectric layer; and
   a second capacitor contact layer located at the upper surface of the first capacitor contact layer, the capacitor dielectric layer covering and directly contacting the upper surface of the substrate, the surface of the bottom electrode layer and an upper surface of the second capacitor contact layer;
   wherein a material of the first capacitor contact layer is different from a material of the second capacitor contact layer, and the material of the second capacitor contact layer is the same as a material of the bottom electrode layer.

2. The capacitor structure according to claim 1, wherein the second capacitor contact layer is electrically connected to the bottom electrode layer, and the second capacitor contact layer and the bottom electrode layer form a bottom electrode.

3. The capacitor structure according to claim 1, wherein the top electrode layer comprises a top electrode material layer and a top electrode filling layer, the top electrode material layer covering the surface of the capacitor dielectric layer, and the top electrode filling layer being located at an upper surface of the top electrode material layer.

4. The capacitor structure according to claim 3, wherein the top electrode filling layer is made of polycrystalline silicon or silicon germanium.

5. The capacitor structure according to claim 3, wherein the top electrode material layer is made of a compound formed by at least one of metal nitride or metal silicide.

6. The capacitor structure according to claim 1, wherein the second capacitor contact layer is consistent with the first capacitor contact layer in shape.

7. The capacitor structure according to claim 1, wherein the first capacitor contact layer and the second capacitor contact layer are both of columnar structures.

8. The capacitor structure according to claim 1, wherein a transistor is formed on an active area of the substrate, and the first capacitor contact layer is electrically connected to the transistor.

9. The capacitor structure according to claim 1, wherein the capacitor dielectric layer is made of a high-K dielectric material or silicon oxide.

10. A method for manufacturing a capacitor structure, comprising:
providing a substrate;
forming a conducting layer on the substrate, and forming a capacitor stacking layer on the conducting layer, wherein the conducting layer comprises a first conducting layer and a second conducting layer, and a material of the first conducting layer is different from a material of the second conducting layer;
patterning the capacitor stacking layer and the conducting layer, to form at least one capacitor column arranged in an array manner from the capacitor stacking layer, a corresponding first capacitor contact layer from the first conducting layer, and a corresponding second capacitor contact layer from the second conducting layer;
depositing a bottom electrode layer to cover a side wall of each of the at least one capacitor column and a side wall of the corresponding first capacitor contact layer, and to extend in a direction of the corresponding first capacitor contact layer away from the substrate, wherein the material of the second conducting layer is the same as a material of the bottom electrode layer;
removing the at least one capacitor column while keeping the bottom electrode layer, the corresponding first capacitor contact layer, and the corresponding second capacitor contact layer;
depositing a capacitor dielectric layer to cover and directly contact a surface of the bottom electrode layer, an upper surface of the substrate, and an upper surface of the corresponding second capacitor contact layer and to cover an upper surface of the corresponding first capacitor contact layer; and
depositing a top electrode layer to cover the capacitor dielectric layer.

11. The method according to claim 10, wherein the method further comprises:
electrically connecting the second capacitor contact layer to the bottom electrode layer, so as to form a bottom electrode.

12. The method according to claim 10, wherein the capacitor stacking layer comprises a sacrificial layer and a top supporting layer, and the step of removing the at least one capacitor column while keeping the bottom electrode layer, the corresponding first capacitor contact layer, and the corresponding second capacitor contact layer comprises:
depositing a mask layer to cover an upper surface of the at least one capacitor column, and form a photoresistor to cover the mask layer, wherein the photoresistor is provided with at least one opening corresponding to the at least one capacitor column in a one-to-one manner; and
removing the mask layer, the top supporting layer and the sacrificial layer along the at least one opening.

13. The method according to claim 10, wherein the top electrode layer comprises a top electrode material layer and a top electrode filling layer, and the step of depositing a top electrode layer to cover the capacitor dielectric layer comprises:
depositing the top electrode material layer to cover a surface of the capacitor dielectric layer, and depositing the top electrode filling layer to cover an upper surface of the top electrode material layer.

14. The method according to claim 10, wherein the step of patterning the capacitor stacking layer and the conducting layer to form at least one capacitor column arranged in an array manner from the capacitor stacking layer, a corresponding first capacitor contact layer from the first conducting layer, and a corresponding second capacitor contact layer from the second conducting layer comprises:
depositing a mask layer to cover a top supporting layer in the capacitor stacking layer;
forming a negative photoresistor to cover the mask layer; and
conducting exposure and development and etching down along the negative photoresistor to the substrate to form the at least one capacitor column arranged in the array manner, the corresponding first capacitor contact layer from the first conducting layer, and the corresponding second capacitor contact layer from the second conducting layer.

15. The method according to claim 10, further comprising:
removing a part, at an upper surface of the at least one capacitor column, of the bottom electrode layer and a part, at the upper surface of the substrate, of the bottom electrode layer.

16. The method according to claim 12, wherein the top supporting layer is removed through dry etching, and the sacrificial layer is removed through dry etching and wet etching.

* * * * *